United States Patent
Tsai et al.

(10) Patent No.: US 8,497,421 B2
(45) Date of Patent: Jul. 30, 2013

(54) LIFT-OFF STRUCTURE FOR SUBSTRATE OF A PHOTOELECTRIC DEVICE AND METHOD THEREOF

(75) Inventors: Yu-Li Tsai, Taoyuan County (TW); Chih-Hung Wu, Taoyuan County (TW); Jei-Li Ho, Taoyuan County (TW)

(73) Assignee: Institute of Nuclear Energy Research Atomic Energy Council, Executive Yuan, Taoyuan County (TW)

( * ) Notice: Subject to any disclaimer, the term of this patent is extended or adjusted under 35 U.S.C. 154(b) by 22 days.

(21) Appl. No.: 13/236,859

(22) Filed: Sep. 20, 2011

(65) Prior Publication Data
US 2013/0048058 A1  Feb. 28, 2013

(30) Foreign Application Priority Data
Aug. 26, 2011  (TW) .............................. 100130742 A

(51) Int. Cl.
*H01L 31/00*  (2006.01)

(52) U.S. Cl.
USPC .......................................................... 136/256

(58) Field of Classification Search
USPC .............................. 136/243–265; 216/40, 24
See application file for complete search history.

(56) References Cited

U.S. PATENT DOCUMENTS

| | | | | |
|---|---|---|---|---|
| 5,626,687 | A | * | 5/1997 | Campbell .................. 136/259 |
| 2009/0038678 | A1 | * | 2/2009 | Pan et al. ..................... 136/255 |
| 2009/0229659 | A1 | * | 9/2009 | Wanlass et al. .............. 136/255 |

* cited by examiner

Primary Examiner — Alicia Toscano
Assistant Examiner — Niki Bakhtiari
(74) Attorney, Agent, or Firm — WPAT, PC; Justin King

(57) ABSTRACT

A lift-off structure for substrate of a photoelectric device and method thereof, which making it possible to enable an etching solution to flow through not only external etch channel but also internal etch channel to etch a sacrificial layer in order to increase the overall etching speed and decrease the overall time of lifting a substrate off.

6 Claims, 6 Drawing Sheets

LIFT-OFF STRUCTURE FOR SUBSTRATE OF A PHOTOELECTRIC DEVICE AND METHOD THEREOF

FIELD OF THE INVENTION

The present invention relates to a lift-off structure for substrate of a photoelectric device and the method thereof, and more particularly, to a lift-off process adapted for semiconductor and photoelectric industries.

BACKGROUND OF THE INVENTION

Generally speaking, under concentrated-light operation condition, III-V multi-junction solar cell can absorb solar energy in a wider wavelength range and as a result its photoelectric conversion efficiency, that is able 42% in laboratory test, is higher than the usual flat-plate solar cell. Hence, the III-V multi-junction solar cells are especially suitable to be applied in large ground-mounted solar power systems for providing electricity in residential sector.

Operationally, the electricity output of a solar cell is influenced by the intensity of the light that shines on it while the electricity output of the solar cell can be fed to and used by an external device through its metal electrodes. In a condition when a solar cell is operating especially under concentrated-light operation condition, there will be an electric current of several amperes or more flowing through the components inside the solar cell, and consequently, if there is any components inside the solar cell that is designed with poor heat dissipating ability in view of thermal resistance, the temperature of such component as well as the whole solar cell will raise after light shines on the solar cell, causing the conversion efficiency of the solar cell to deteriorate, i.e. the current-voltage characteristics of the solar cell are adversely affected.

Conventionally, for improving the thermal conducting ability of a GaAs-based solar cell, the solar cell that is formed on a raw GaAs substrate is first being attached to an adhesive layer of a metal substrate that is formed with high heat-dissipating ability by wafer bonding, and then a chemical solution, such as a mixing solution of ammonia, hydrogen peroxide and water, is used for etching the raw GaAs substrate so as to prepare the same for having a layer of metallic electrode grids to be formed therein, as shown in FIG. 1. Thereby, a structure of a solar cell attaching to a metal substrate with high heat-dissipating ability is achieved.

As the raw GaAs substrate will be etching away by the chemical solution in the aforesaid conventional solar cell manufacturing process, thus such manufacturing process is disadvantageous in that: first, the raw substrate can not be recycled and used repetitively; and second, the manufacturing cost is increased comparing with those solar cells without the metal substrate with high heat-dissipating ability, owing to the acquisition costs of the raw substrate and the metal substrate with high heat-dissipating ability, and the waste management cost for treating the arsenic-containing waste liquid resulting from the manufacturing process.

Conventionally, in order to overcome the aforesaid shortcomings, a prior-art technique is provided, in which the raw substrate is separated from the solar cell and thus removed by the selectively etching of a sacrificial layer using a chemical solution. Taking the photoelectric devices including the light emitting diodes and solar cells for example, the method for lifting off substrates of such photoelectric devices is performed through the use of a thin layer of high-aluminum-containing AlGaAs sacrificial film that is sandwiched between the corresponding epitaxial substrate and photoelectric film, as the high-aluminum-containing AlGaAs sacrificial layer is featured by that it is easy to reacted to and thus be etched by hydrofluoric acid-containing solution. However, since such etching of the sacrificial layer can only be performed starting from the lateral of a wafer used for forming solar cells, the lateral etching rate of the sacrificial layer can be very low due to the restriction of capillary action and the limitation relating to a minimum contact area. Therefore, it can take a very long period of time just for performing a substrate lift-off process upon a large-size wafer. Thus, such prior-art technique for separating the raw substrate might not be feasible for industrial mass production.

SUMMARY OF THE INVENTION

In view of the disadvantages of prior art, the object of the present invention is to provide a lift-off structure for substrate of a photoelectric device and the method thereof, by that not only contact area for etching can be increased effectively, but also the time spent for substrate lifting-off can be reduced significantly.

In an embodiment, the present invention provides a lift-off structure, adapted for a substrate composed of a buffer layer, an etch stop layer, a protective layer, a sacrificial layer, and a photoelectric element in a manner that the buffer layer is formed on one side of the substrate, the etch stop layer is formed on a side of the buffer layer that is opposite to the substrate, the protective layer is formed on a side of the etch stop layer that is opposite to the buffer layer, the sacrificial layer is formed on a side of the protective layer that is opposite to the etch stop layer, and the photoelectric element is formed on a side of the sacrificial layer that is opposite to the protective layer, the lift-off structure comprising: a metal layer, formed on a side of the photoelectric element that is opposite to the sacrificial layer while allowing the metal layer to be formed with at least one pattern in a manner that each pattern is formed with at least one internal etch channel while allowing any two neighboring patterns to be separated by one external etch channel.

In an embodiment of the present invention, a lithography/deposition method is provided for forming patterns on the metal layer which comprises the steps of:
  enabling a wafer to be formed with a plurality of patterns so as to be used for defining a plurality of chips as each pattern is formed the same as its corresponding chip in size, in a manner that each pattern has at least one internal etch channel defined therein, and any two neighboring patterns are separated by one external etch channel defined therebetween, while allowing each internal etch channel to be in fluid communication with the corresponding external etch channel;
  using an etching solution to perform an etching operation respectively upon the patterns for forming chips on the wafer while allowing the etching of the etch solution to etch the internal etch channels and the external etch channels respectively to a depth reaching the sacrificial layer;
  sinking the wafer into a hydrofluoric acid-containing solution for enabling the hydrofluoric acid-containing solution to flow along the external etch channels into the wafer and thus reach the sacrificial layer so as to enable a side etching effect surrounding each individual chip, and simultaneously for allowing the hydrofluoric acid-containing solution to flow into the internal etch channel through the corresponding external etch channels so as to further speed up the sacrificial layer to be etched away by the side etching effect, resulting that the time spent for substrate lifting-off can be reduced significantly.

To sum up, by the configuration of the internal etch channels and the external etch channels in the metal layer, the time spent for substrate lifting-off can be reduced significantly since the etching solution can be enabled to flow through the external etch channels and the internal etch channels so as to speed up the desired side etching effect.

Comparing with prior arts, the present invention has the following advantages:
1. the desired side etching effect can be accelerated;
2. the time spent for substrate lifting-off can be reduced significantly;
3. the adverse affect of capillary action with slow etching efficiency can be improved by the proper etching channel design.

Thus, the present invention can have good market competitiveness.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
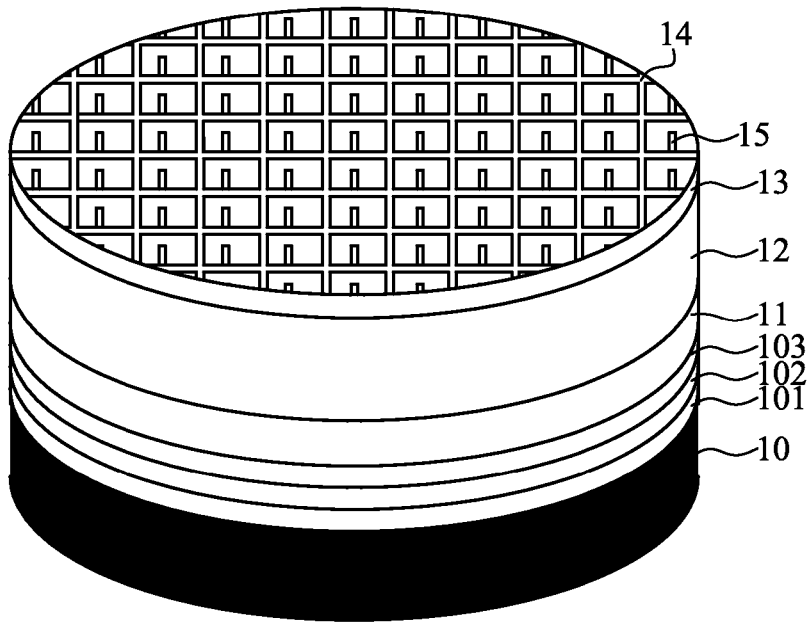
FIG. 1 is a schematic diagram showing a lift-off structure for substrate of a photoelectric device according to a first embodiment of the invention.

Please refer to FIG. 1, which is a schematic diagram showing a lift-off structure for substrate of a photoelectric device according to a first embodiment of the invention. As shown in FIG. 1, the present invention provides a lift-off structure, which is adapted for a substrate 10 composed of a buffer layer 101, an etch stop layer 102, a protective layer 103, a sacrificial layer 11, and a photoelectric element 12 in a manner that the buffer layer 101 is formed on one side of the substrate 10, the etch stop layer 102 is formed on a side of the buffer layer 101 that is opposite to the substrate, the protective layer 103 is formed on a side of the etch stop layer 102 that is opposite to the buffer layer 101, the sacrificial layer 11 is formed on a side of the protective layer 103 that is opposite to the etch stop layer 102, and the photoelectric element 12 is formed on a side of the sacrificial layer 11 that is opposite to the protective layer 103.

In the embodiment shown in FIG. 1, the lift-off structure comprises: a metal layer 13, which is formed on a side of the photoelectric element 12 that is opposite to the sacrificial layer 11 while allowing the metal layer 13 to be formed with at least one pattern in a manner that each pattern is formed with an internal etch channel 15 while allowing any two neighboring patterns to be separated by one external etch channel 14. It is noted that each pattern can be formed in a shape of a polygon and also each internal etch channel 15 can be formed in a shape of a polygon, and in this embodiment, the pattern is formed as a rectangle and the internal etch channel is formed as a long stripe at a side of the rectangle-shaped pattern.

The description relating to the embodiments that is provided hereinafter is focused on the configuration of the metal layer. As the metal layer is disposed on the substrate at a position that same as that in the aforesaid embodiment, and also as the substrate is structured the same as the one shown in the aforesaid embodiment, the structure of the substrates used in the following embodiments will not be described further and using the same numbering.

Figure 2:
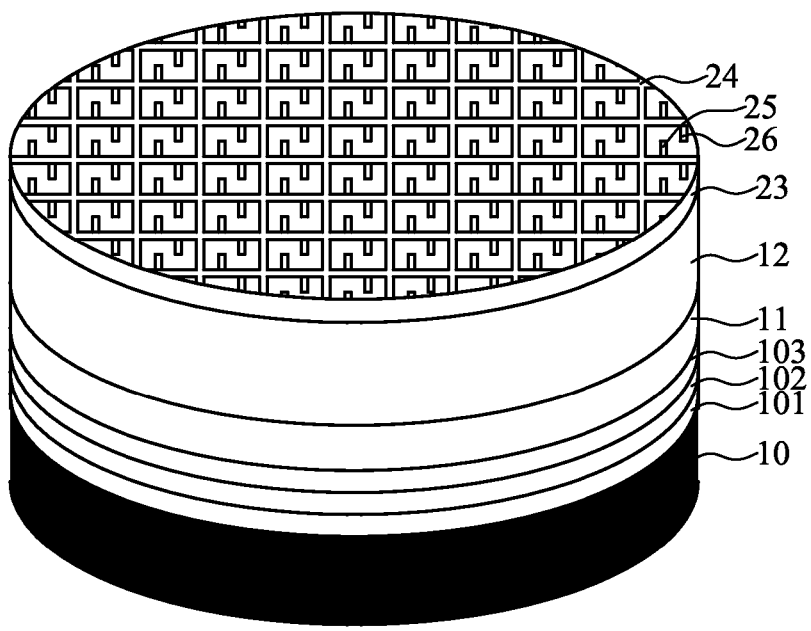
FIG. 2 is a schematic diagram showing a lift-off structure for substrate of a photoelectric device according to a second embodiment of the invention.

Please refer to FIG. 2, which is a schematic diagram showing a lift-off structure for substrate of a photoelectric device according to a second embodiment of the invention. In this embodiment, the metal layer 23 is formed on a side of the photoelectric element 12 that is opposite to the sacrificial layer 11 while allowing the metal layer 23 to be formed with at least one pattern in a manner that each pattern, being formed in a shape of a rectangular, is configured with one first internal etch channel 25 and one second internal etch channel 26 respectively at sides of the corresponding rectangular-shaped pattern that are opposite to each other, while allowing any two neighboring patterns to be separated by one external etch channel 24. It is noted that each of the first and the second internal etch channels 25, 26 can be formed in a shape of a polygon, and in this embodiment, each of the first and the second internal etch channels 25, 26 is formed as a long stripe.

Figure 3:
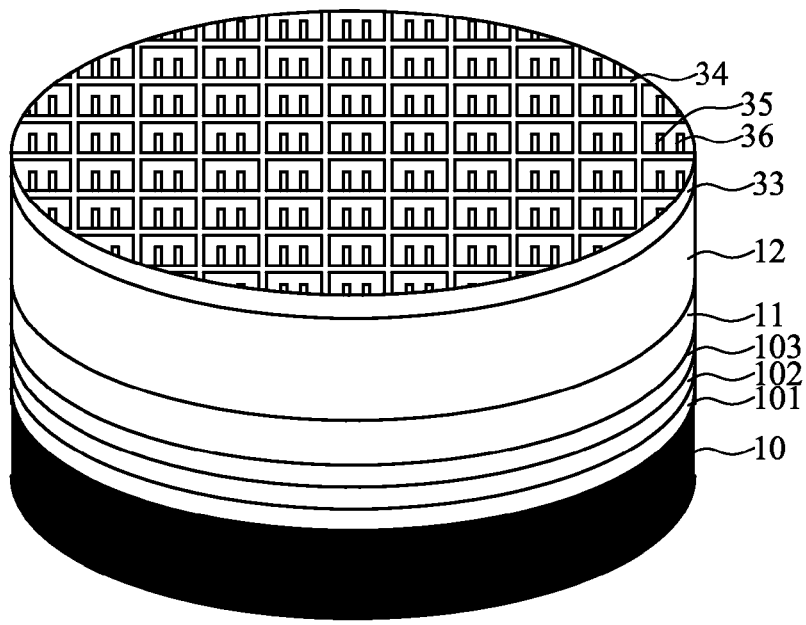
FIG. 3 is a schematic diagram showing a lift-off structure for substrate of a photoelectric device according to a third embodiment of the invention.

Please refer to FIG. 3, which is a schematic diagram showing a lift-off structure for substrate of a photoelectric device according to a third embodiment of the invention. In this embodiment, the metal layer 33 is formed on a side of the photoelectric element 12 that is opposite to the sacrificial layer 11 while allowing the metal layer 33 to be formed with at least one pattern in a manner that each pattern, being formed in a shape of a rectangular, is configured with one first internal etch channel 35 and one second internal etch channel 36 at the same side of the corresponding rectangular-shaped pattern, while allowing any two neighboring patterns to be separated by one external etch channel 34. It is noted that each of the first and the second internal etch channels 35, 36 can be formed in a shape of a polygon, and in this embodiment, each of the first and the second internal etch channels 35, 36 is formed as a long stripe.

Figure 4:
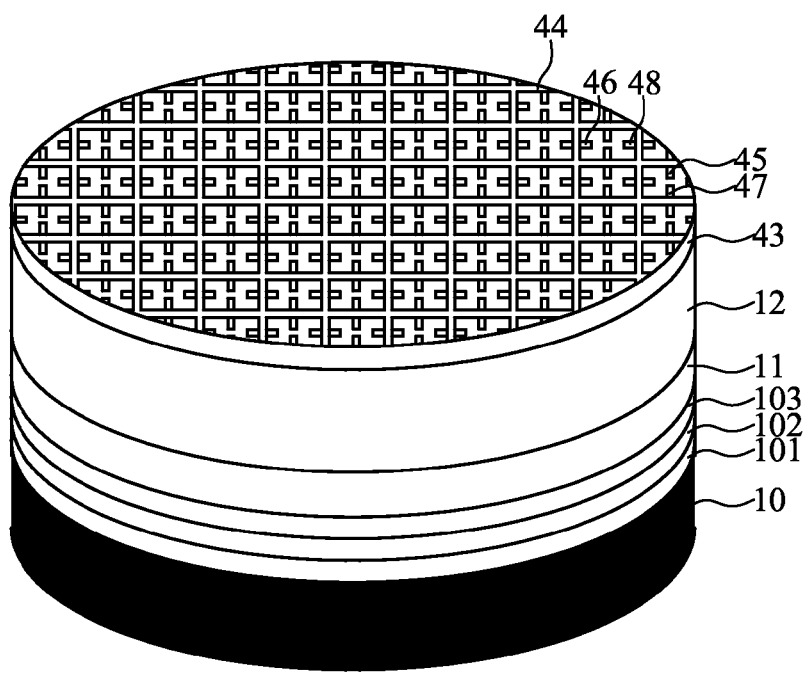
FIG. 4 is a schematic diagram showing a lift-off structure for substrate of a photoelectric device according to a fourth embodiment of the invention.

Please refer to FIG. 4, which is a schematic diagram showing a lift-off structure for substrate of a photoelectric device according to a fourth embodiment of the invention. In this embodiment, the metal layer 43 is formed on a side of the photoelectric element 12 that is opposite to the sacrificial layer 11 while allowing the metal layer 43 to be formed with at least one pattern in a manner that each pattern, being formed in a shape of a rectangular, is configured with one first internal etch channel 45, one second internal etch channel 46, one third internal etch channel 47 and one fourth internal etch channel 48 respectively at the four sides of the corresponding rectangular-shaped pattern, while allowing any two neighboring patterns to be separated by one external etch channel 44. It is noted that each of the first, the second, the third and the fourth internal etch channels 45, 46, 47 and 48 can be formed in a shape of a polygon, and in this embodiment, each of the first, the second, the third and the fourth internal etch channels 45, 46, 47 and 48 is formed as a long stripe.

Figure 5:
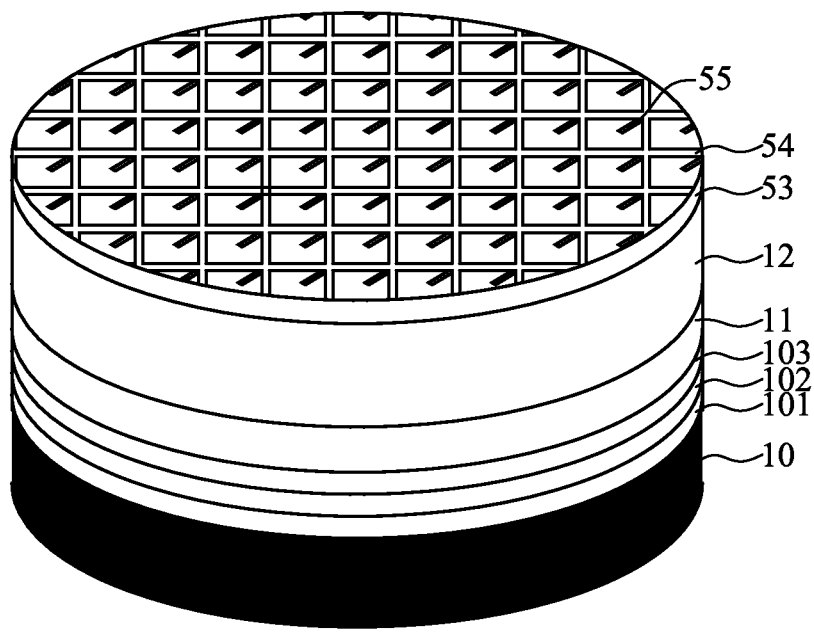
FIG. 5 is a schematic diagram showing a lift-off structure for substrate of a photoelectric device according to a fifth embodiment of the invention.

Please refer to FIG. 5, which is a schematic diagram showing a lift-off structure for substrate of a photoelectric device according to a fifth embodiment of the invention. In this embodiment, the metal layer 53 is formed on a side of the photoelectric element 12 that is opposite to the sacrificial layer 11 while allowing the metal layer 53 to be formed with at least one pattern in a manner that each pattern, being formed in a shape of a rectangular, is configured with one internal etch channel 55 at a corner of the corresponding rectangular-shaped pattern, while allowing any two neighboring patterns to be separated by one external etch channel 54. It is noted that the internal etch channel 55 can be formed in a shape of a polygon, and in this embodiment, the internal etch channel 55 is formed as a long stripe.

Figure 6:
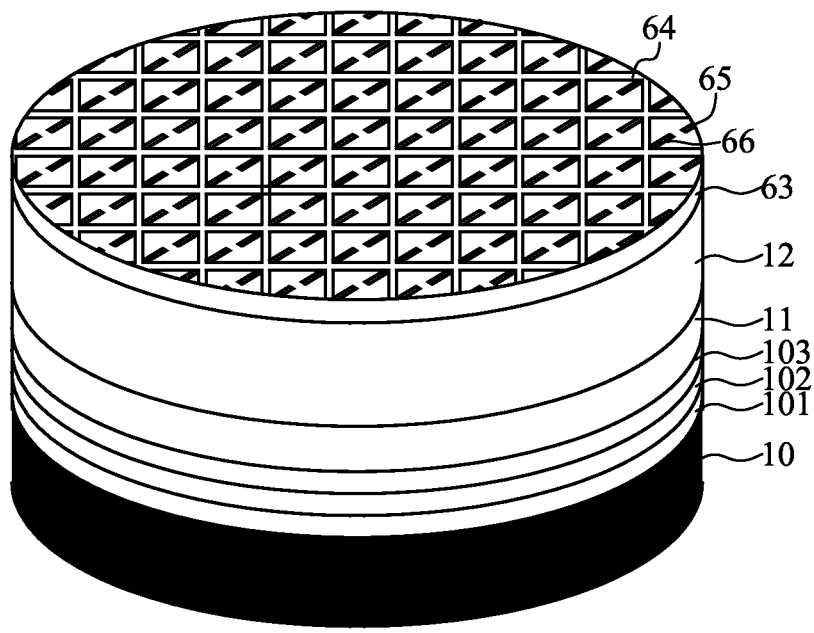
FIG. 6 is a schematic diagram showing a lift-off structure for substrate of a photoelectric device according to a sixth embodiment of the invention.

Please refer to FIG. 6, which is a schematic diagram showing a lift-off structure for substrate of a photoelectric device according to a sixth embodiment of the invention. In this embodiment, the metal layer 63 is formed on a side of the photoelectric element 12 that is opposite to the sacrificial layer 11 while allowing the metal layer 63 to be formed with at least one pattern in a manner that each pattern, being formed in a shape of a rectangular, is configured with one first internal etch channel 65 and one second internal etch channel 66 respectively at two different corners of the corresponding rectangular-shaped pattern, while allowing any two neighboring patterns to be separated by one external etch channel 64. It is noted that the first and the second internal etch channels 65, 66 can be formed in a shape of a polygon, and in this embodiment, the first and the second internal etch channels 65, 66 are formed as a long stripe.

Figure 7:
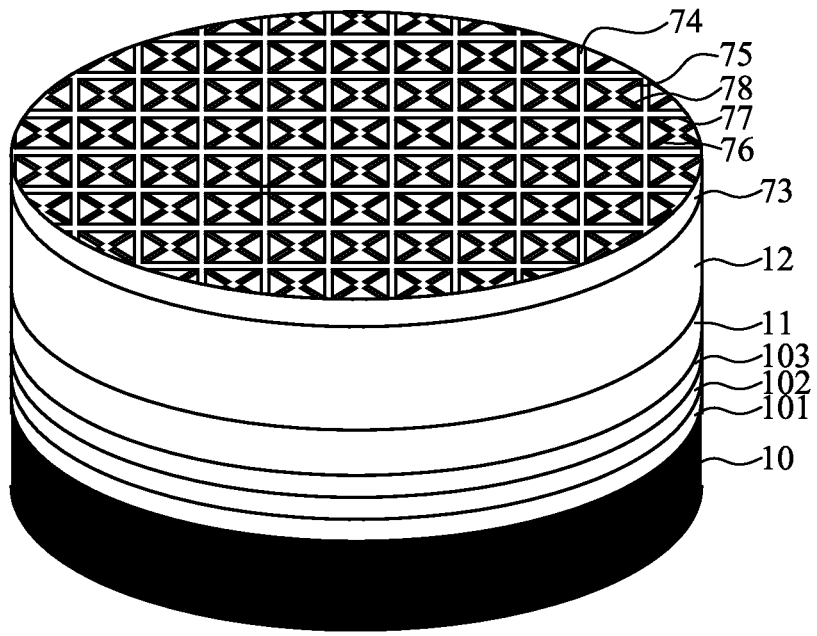
FIG. 7 is a schematic diagram showing a lift-off structure for substrate of a photoelectric device according to a seventh embodiment of the invention.

Please refer to FIG. 7, which is a schematic diagram showing a lift-off structure for substrate of a photoelectric device according to a seventh embodiment of the invention. In this embodiment, the metal layer 73 is formed on a side of the photoelectric element 12 that is opposite to the sacrificial layer 11 while allowing the metal layer 73 to be formed with at least one pattern in a manner that each pattern, being formed in a shape of a rectangular, is configured with one first internal etch channel 75, one second internal etch channel 76, one third internal etch channel 77 and one fourth internal etch channel 78 respectively at the four corners of the corresponding rectangular-shaped pattern, while allowing any two neighboring patterns to be separated by one external etch channel 74. It is noted that the first, the second, the third and the fourth internal etch channels 75, 76, 77 and 78 can be formed in a shape of a polygon, and in this embodiment, the first, the second, the third and the fourth internal etch channels 75, 76, 77 and 78 are formed as a long stripe.

Figure 8:
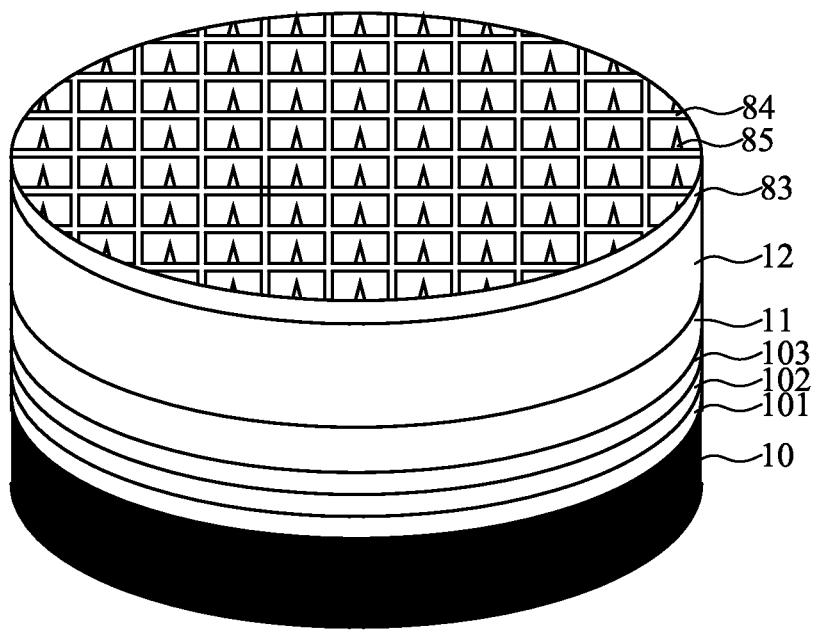
FIG. 8 is a schematic diagram showing a lift-off structure for substrate of a photoelectric device according to an eighth embodiment of the invention.

Please refer to FIG. 8, which is a schematic diagram showing a lift-off structure for substrate of a photoelectric device according to an eighth embodiment of the invention. In this embodiment, the metal layer 83 is formed on a side of the photoelectric element 12 that is opposite to the sacrificial layer 11 while allowing the metal layer 83 to be formed with at least one pattern in a manner that each pattern, being formed in a shape of a rectangular, is configured with one triangle-shaped internal etch channel 85 at a side of the corresponding rectangular-shaped pattern, while allowing any two neighboring patterns to be separated by one external etch channel 84. It is noted that the internal etch channel 85 can be formed in a shape of a polygon, and in this embodiment, the internal etch channel 85 is formed as a triangle.

Figure 9:
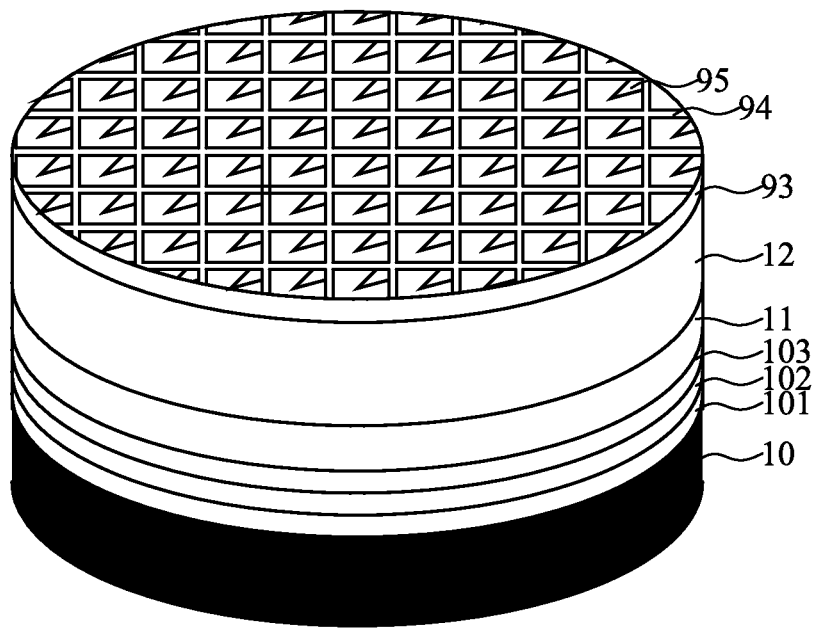
FIG. 9 is a schematic diagram showing a lift-off structure for substrate of a photoelectric device according to a ninth embodiment of the invention.

Please refer to FIG. 9, which is a schematic diagram showing a lift-off structure for substrate of a photoelectric device according to a ninth embodiment of the invention. In this embodiment, the metal layer 93 is formed on a side of the photoelectric element 12 that is opposite to the sacrificial layer 11 while allowing the metal layer 93 to be formed with at least one pattern in a manner that each pattern, being formed in a shape of a rectangular, is configured with one triangle-shaped internal etch channel 95 at a corner of the corresponding rectangular-shaped pattern, while allowing any two neighboring patterns to be separated by one external etch channel 94. It is noted that the internal etch channel 95 can be formed in a shape of a polygon, and in this embodiment, the internal etch channel 95 is formed as a triangle.

Figure 10:
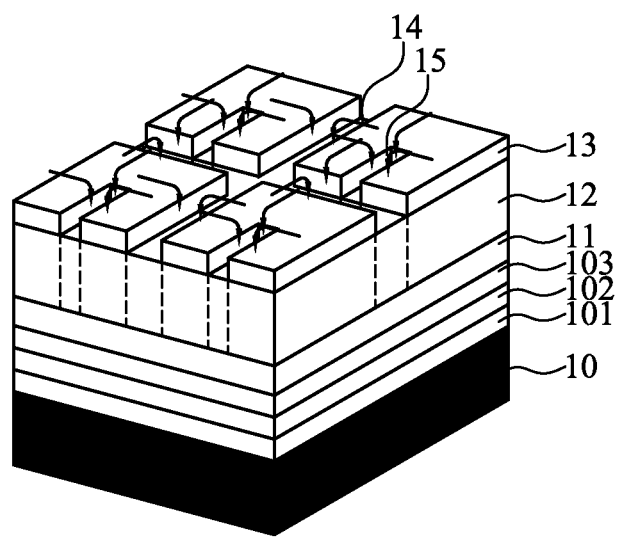
FIG. 10 is a schematic diagram showing how an etching solution is designed to flow during the lifting off of a substrate according to the present invention.
Figure 11:
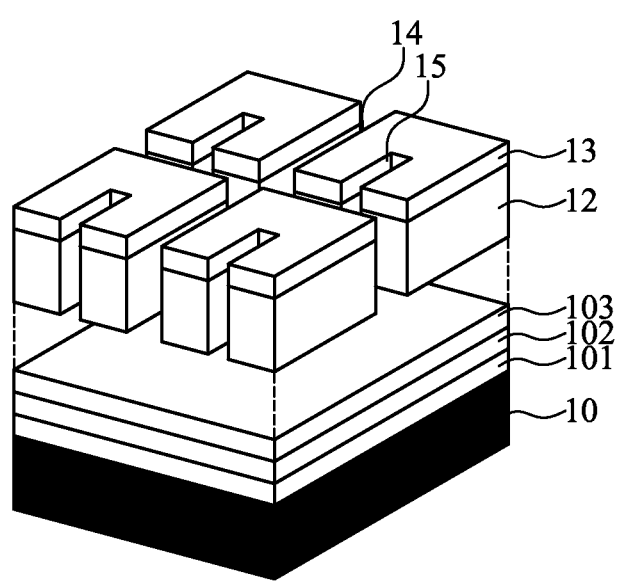
FIG. 11 is a schematic diagram showing a substrate after being lift off according to the present invention.

Please refer to FIG. 10 and FIG. 11, which are schematic diagrams respectively showing how an etching solution is designed to flow during the lifting off of a substrate, and a substrate after being lift-off according to the present invention. As shown in FIG. 10, any two neighboring patterns are separated by an external etch channel and each pattern itself is designed to have at least one internal etch channel defined therein while allowing the internal etch channels to be arranged in fluid communication with the external etch channels. Thereby, during the performing of an etching operation using an etching solution so as to construct chips on a wafer, the etch solution is able to etch and form the plural internal etch channels and the external etch channels respectively to a depth reaching the sacrificial layer, in the directions indicating by the arrows shown in FIG. 10 all the way toward the sacrificial layer 11. After reaching the sacrificial layer 11, the etching solution will start to etch the sacrificial layer 11 until the sacrificial layer 11 is being etched away completely for completing the lifting off of the substrate 10, resulting that the time required for completing the etching of the sacrificial layer is reduced and thus the time spent for substrate lifting-off can be reduced significantly.

To sum up, by the configuration of the internal etch channels and the external etch channels in the metal layer, the time spent for substrate lifting-off can be reduced significantly since the etching solution can be enabled to flow through the external etch channels and the internal etch channels so as to speed up the desired side etching effect.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A lift-off structure for manufacturing a photoelectric device, comprises:
    a substrate;
    a buffer layer disposed on said substrate;
    an etch stop layer disposed on said buffer layer;
    a protective layer disposed on said etch stop layer;
    a sacrificial layer disposed on said protective layer;
    a photoelectric element disposed on said sacrificial layer; and
    a metal layer disposed on said photoelectric element, comprising a first etched channel, a second etched channel, and a third etched channel, wherein said first etched channel, said second etched channel, and said third etched channel are etched to expose said photoelectric element, said first etched channel and said second etched channel are intersected to define a plurality of regions on said metal layer, and said third etched channel is within one of said regions and connected to said first etched channel;
    wherein said first etched channel, said second etched channel, and said third etched channel facilitate a etching solution for etching said photoelectric element and for further deepening said first etched channel said second etched channel, and said third etched channel to define said photoelectric element into a plurality of chips and to expose said sacrificial layer, and to further facilitate a hydrofluoric acid solution to etch said sacrificial layer.

2. The lift-off structure of claim 1, wherein said third etched channel is formed at at least one side or at least one corner of each of said plurality of regions.

3. The lift-off structure of claim 2, wherein said third etched channel is formed in a shape of a polygon.

4. The lift-off structure of claim 3, wherein said third etched channel is formed in a shape of a triangle, or a long stripe.

5. The lift-off structure of claim 4, wherein of said plurality of regions is formed in a shape of a polygon.

6. The lift-off structure of claim 5, wherein each of said plurality of regions is formed in a shape of a rectangle.

* * * * *